United States Patent
Gelzer et al.

[11] Patent Number: 5,216,360
[45] Date of Patent: Jun. 1, 1993

[54] VACUUM-TIGHT SIGNAL LINES IN A TESTING APPARATUS FOR COMPONENTS

[75] Inventors: Friedbert Gelzer; Volker Wuerttenberger, both of Augsburg, Fed. Rep. of Germany

[73] Assignee: Siemens Nixdorf Informationssysteme AG, Fed. Rep. of Germany

[21] Appl. No.: 811,268

[22] Filed: Dec. 30, 1991

[30] Foreign Application Priority Data

Dec. 20, 1990 [DE] Fed. Rep. of Germany ....... 4041027

[51] Int. Cl.$^5$ ............................................. G01R 31/26
[52] U.S. Cl. ................... 324/158 F; 324/73.1; 324/158 R
[58] Field of Search ................ 324/158 R, 158 D, 96, 324/73.1, 71.3; 250/310, 311, 492.1, 492.2

[56] References Cited

U.S. PATENT DOCUMENTS

| | | | |
|---|---|---|---|
| 4,864,228 | 9/1989 | Richardson | 324/158 R |
| 4,875,004 | 10/1989 | Boyd | 324/158 D |
| 4,881,591 | 11/1989 | Rignall | 324/158 R |
| 5,039,938 | 8/1991 | Kohnen et al. | 324/158 R |
| 5,041,783 | 8/1991 | Ohta et al. | 324/158 D |

*Primary Examiner*—Vinh Nguyen
*Attorney, Agent, or Firm*—Hill, Steadman & Simpson

[57] ABSTRACT

A testing apparatus for components which are tested using an electric or an ion beam in a vacuum chamber overcomes seal problems by providing electrical connection to the component to be tested through a multilayer printed circuit board. The multilayer printed circuit board may be connected to a needle adapter within the vacuum chamber for providing the electrical connection to the component.

2 Claims, 2 Drawing Sheets

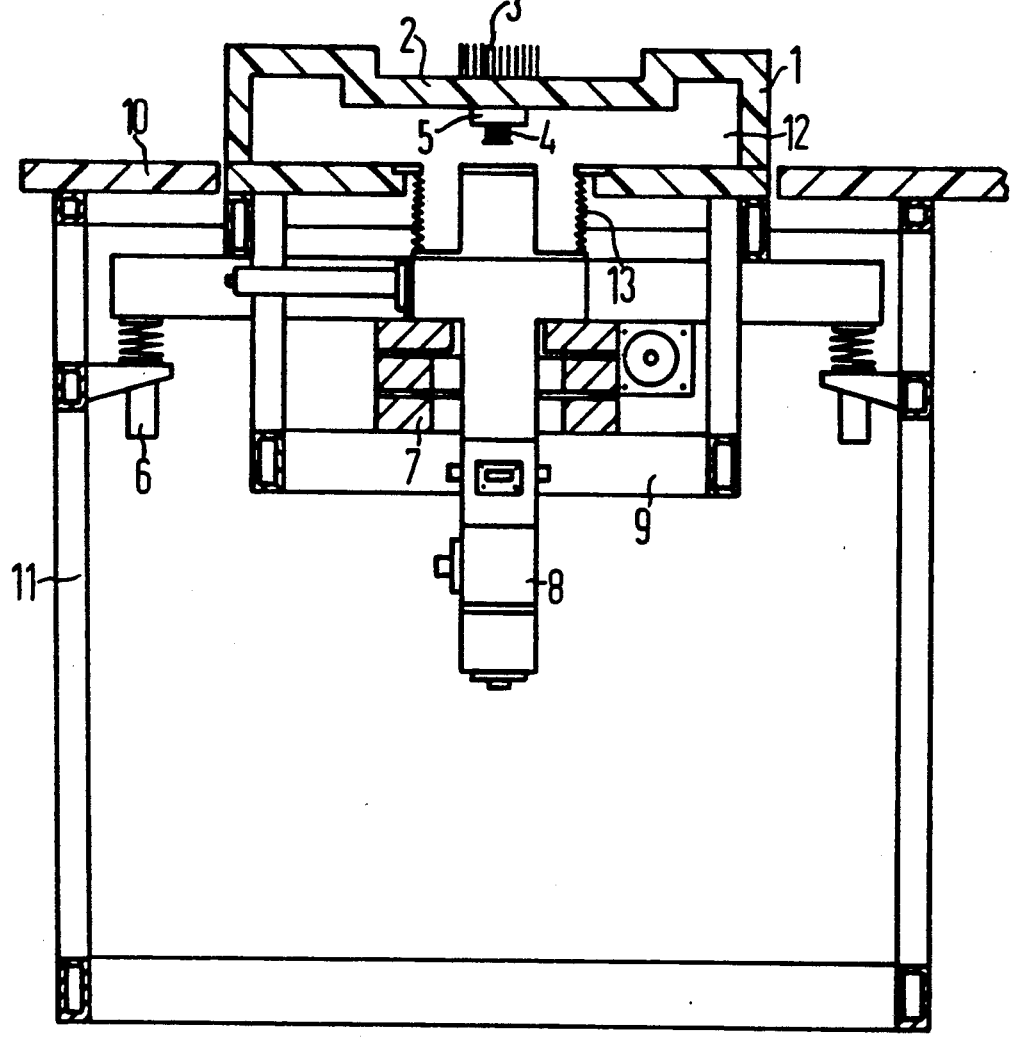

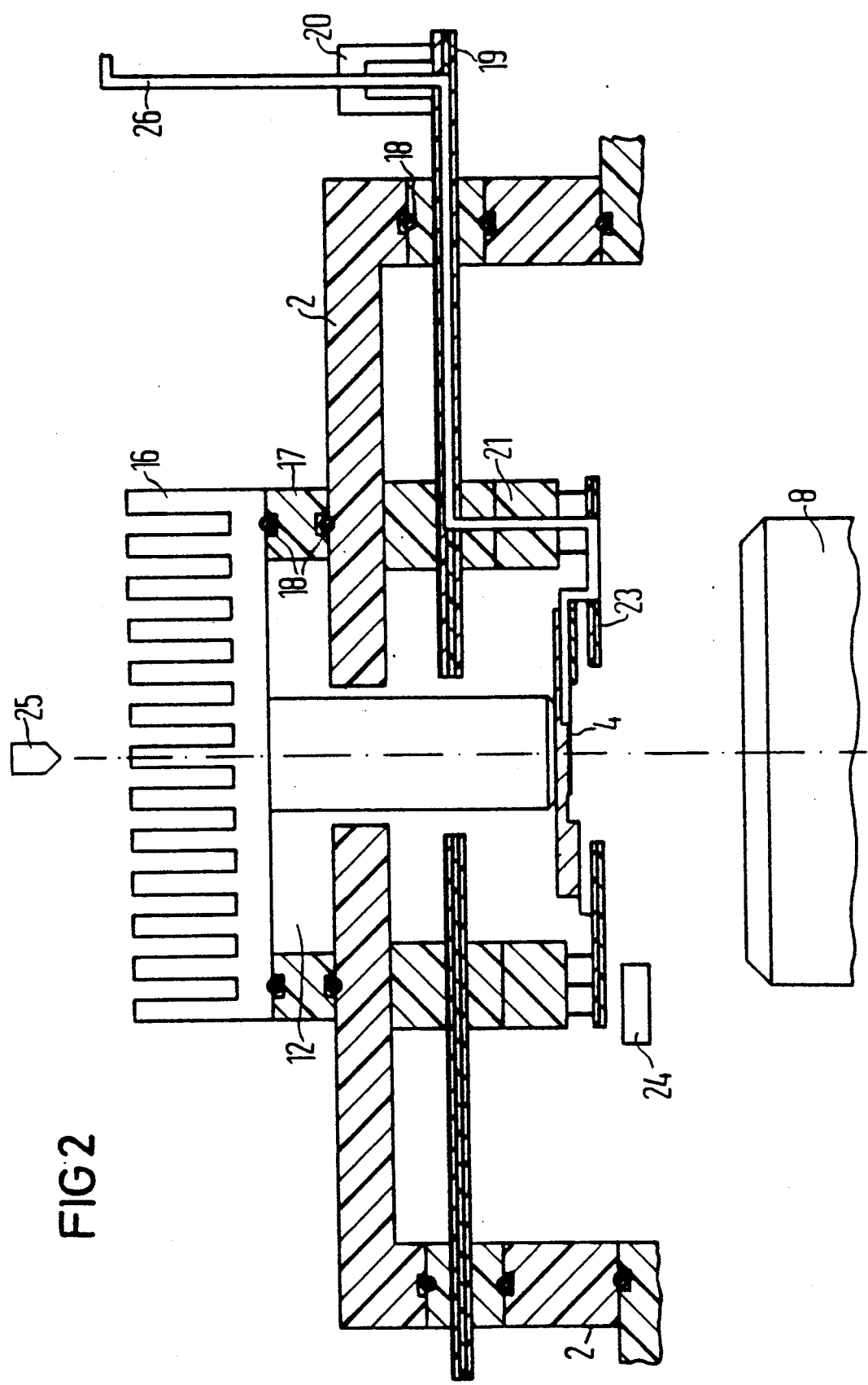

VACUUM-TIGHT SIGNAL LINES IN A TESTING APPARATUS FOR COMPONENTS

BACKGROUND OF THE INVENTION

1. Field of the Invention

The present invention is directed generally to a testing apparatus for components being tested with a focused electron or ion beam in a vacuum chamber that is accessible via a covering and, more particularly, to signal lines for carrying electrical signals into the vacuum chamber.

2. Description of the Related Art

Testing of electronic components may be carried out by directing an election beam, ion beam or other beam onto the component while the component is being operated. The component is frequently mounted in a vacuum chamber for testing. During testing by such testing equipment such as, for example, an electron beam measuring instrument for testing electronic components, up to several hundred electrical signals must be conducted into the evacuated or vacuum chamber for driving the unit under test. Bushings about the lines carrying these electrical signals into the vacuum chamber must be sealed, which is expensive and may lead to leaks. Moreover, due to the many plug connections required in the signal path, there is a risk of contacting errors in the lines carrying the signals.

SUMMARY OF THE INVENTION

An object of the present invention is to reduce the problems occurring in the vacuum-tight lead-through of signal lines into a vacuum chamber.

To achieve this and other objects of the invention, a testing apparatus according to the principles of the present invention comprises a multilayer printed circuit board used for conducting signals into the vacuum chamber, the upper and lower layers, or surfaces, of the multilayer printed circuit board being smooth and being sealed with seals at the locations where the printed circuit board penetrates the vacuum chamber. A plurality of signal carrying paths for the signals are provided in the multilayer board.

According to a further development of the invention, the testing apparatus includes terminal contacts at the portion of the printed circuit board lying outside the vacuum chamber through which the signal and supply voltages for testing the component are supplied. At least one needle adapter, also referred to as a contact pin arrangement such as of spring biased pins, is arranged in a portion of the printed circuit board lying within the vacuum chamber. The contact needles of the needle adapter transmit the externally supplied signal and supply voltages to an auxiliary adapter, that may be a printed circuit board, on which the component to be tested is contacted.

The sealing problems of the vacuum chamber are considerably reduced by the foregoing measures since it is no longer necessary to individually seal each signal pin of a plug connection. Moreover, two plug contacts per signal path are saved by the apparatus of the invention as compared to the traditional structure.

BRIEF DESCRIPTION OF THE DRAWINGS

The invention shall be set forth in greater detail with reference to exemplary embodiments shown in the drawing figures, wherein:

FIG. 1 is a schematic view, generally in cross section, of an electron beam measuring instrument according to the prior art; and FIG. 2 is a schematic view, generally in cross section of an electron beam measuring instrument incorporating the vacuum-tight signal lines in a testing apparatus according to the principles of the present invention.

DESCRIPTION OF THE PREFERRED EMBODIMENTS

A known electron beam measuring instrument is shown is the brochure "Technologie IDS 4000 Integrated Diagnostic System" of the Schlumberger Company with which it is possible to quickly and precisely identify faults in integrated circuits or printed circuit boards. The basic structure of this known electron beam measuring instrument is shown in FIG. 1. An opto-electronic column 8 is arranged vertically and is connected to generate an electron beam. The column 8 is held in a receptacle frame 9 that also contains an adjustment system 7 which allows for displacement of the opto-electronic column 8 in a horizontal X-Y plane. The overall apparatus 1 is situated in a cabinet 11 that is part of a work station which is covered by a work plate 10. A unit under test, or component, 4 is mounted inside a vacuum chamber 12 which is accessible via a cover hood 2 that projects from the work plate 10. A mount 5 for accepting the device under test 4 is attached to the inside of the cover hood 2, and the individual contacts of the mount 5 are conducted vacuum tight to the outside of the vacuum chamber 12 through the cover hood 2 via terminal pins 3. The opto-electronic column 8 projects into the vacuum chamber 12 and is sealed by a bellows 13. With this known arrangement, every individual signal pin 3 must be individually sealed, which can lead to considerable sealing problems.

A portion of an electron beam measuring instrument according to the present invention is shown schematically in FIG. 2. The signal paths at the upper side of the cover hood 2 of the known apparatus have been replaced by a multilayer printed circuit board 19 which is laterally introduced into the cover hood 2 and is glued fast at the introduction points. The multilayer printed circuit board is sealed in the hood 2 via sealing rings 18. Terminal contacts 20 through which signal and supply lines 26 are conducted into the inside of the vacuum chamber 12 are provided on a portion of the printed circuit board 19 which lies outside the vacuum chamber 12. A needle adapter, or contact pin arrangement, 21 is applied to a portion of the printed circuit board 19 within the vacuum chamber, the needle adapter 21 providing a connection between the printed circuit board 19 and a further auxiliary adapter 23. The auxiliary adapter 23 of the preferred embodiment is a printed circuit board. It is, thus, the auxiliary adapter 23 on which the component 4 to be tested is contacted, or mounted.

The adjustably mounted opto-electronic column 8 which generates an electron or ion-beam is arranged under the component 4 so that the beam may be directed onto the component 4. A cooling means composed of a cooling die 14 and of a heat sink 16 is provided with cooling ribs with which the cooling die is in thermal contact, the cooling die 14 being mounted above the component 4. The vacuum chamber 12 is sealed by an electrically insulating ring 17 as well as seals 18.

The path of the signal and supply leads are referenced 26 in FIG. 2. The contacting of the auxiliary adapter 23 to the needle adapter 21 is provided by a set of spring contacts having many poles, which is held by a schematically illustrated pressing mechanism 24. A regulated cooling air source 25 is provided for blowing air over the cooling ribs 16 for the elimination of heat.

Thus, there is shown and described a testing apparatus for components which are tested by an electron or an ion beam in a vacuum chamber in which the electrical connection to the component is through a multilayer printed circuit board which extends into the vacuum chamber for conducting the signal voltages and supply voltages into and out of the vacuum chamber.

Although other modifications and changes may be suggested by those skilled in the art, it is the intention of the inventors to embody within the patent warranted hereon all changes and modifications as reasonably and properly come within the scope of their contribution to the art.

We claim:

1. A testing apparatus for components being tested with a charged particle beam device, comprising:
   a vacuum chamber within which a component to be tested is mountable;
   a covering mounted on said vacuum chamber to provide access to said vacuum chamber;
   a multilayer printed circuit board extending into said vacuum chamber and having signal carrying paths connectable to the component to be tested for conducting signals into said vacuum chamber, upper and lower layers of said multilayer printed circuit board being smooth; and
   seals in sealing engagement with said upper and lower layers of said multilayer printed circuit board, said seals being at locations where said multilayer printed circuit board extends into said vacuum chamber.

2. A testing apparatus as claimed in claim 1, further comprising:
   terminal contacts on a portion of said multilayer printed circuit board lying outside said vacuum chamber, said terminal contacts being connected to said signal carrying paths for supplying signal voltages and supply voltages to the component to be tested;
   an auxiliary adapter comprising a printed circuit board on which the component to be tested is mountable; and
   at least one needle adapter arranged on a portion of said multilayer printed circuit board lying within said vacuum chamber, said at least one needle adapter providing electrical contact between said signal paths of said multilayer printed circuit board and said auxiliary adapter to transmit the signal voltages and supply voltages between said terminal contacts and the component to be tested.

* * * * *

UNITED STATES PATENT AND TRADEMARK OFFICE
CERTIFICATE OF CORRECTION

PATENT NO.   : 5,216,360
DATED        : June 1, 1993
INVENTOR(S)  : Friedbert Gelzer and Volker Wuerttenberger It is certified that error appears in the above-identified patent and that said Letters Patent is hereby corrected as shown below:

On the title page, change item (22) from:

"Filed: Dec. 30, 1991" to --Filed: Dec. 20, 1991--.

Signed and Sealed this

Seventh Day of June, 1994

Attest:

BRUCE LEHMAN

Attesting Officer    Commissioner of Patents and Trademarks